United States Patent [19]

Tanagawa

[11] Patent Number: 5,339,271
[45] Date of Patent: Aug. 16, 1994

[54] SEMICONDUCTOR MEMORY CIRCUIT

[75] Inventor: Kouji Tanagawa, Tokyo, Japan

[73] Assignee: Oki Electric Industry Co., Ltd., Tokyo, Japan

[21] Appl. No.: 846,205

[22] Filed: Mar. 4, 1992

[30] Foreign Application Priority Data

Mar. 5, 1991 [JP] Japan .................. 3-038383

[51] Int. Cl.$^5$ .............................................. G11C 7/00
[52] U.S. Cl. ................... 365/189.04; 365/218; 365/185
[58] Field of Search .............. 371/21.4; 365/189.04, 365/218, 185, 190, 189.07

[56] References Cited

U.S. PATENT DOCUMENTS

| | | | |
|---|---|---|---|
| 4,803,662 | 2/1989 | Tanaka | 365/185 |
| 4,901,320 | 2/1990 | Sawada et al. | 371/51.1 |
| 5,101,381 | 3/1992 | Kouzi | 365/218 |

FOREIGN PATENT DOCUMENTS

64-59693  3/1989  Japan .

Primary Examiner—Eugene R. LaRoche
Assistant Examiner—A. Zarabian
Attorney, Agent, or Firm—Edward D. Manzo

[57] ABSTRACT

A semiconductor memory circuit includes memory cells each having two storage semiconductor elements. One of these semiconductor elements is made inoperative in response to a first or a second operation control signal. This makes it possible to check the margin of a threshold voltage of the other storage semiconductor element at the time when writing, erasing and reading operations with respect thereto are being performed.

26 Claims, 4 Drawing Sheets

SEMICONDUCTOR MEMORY CIRCUIT

BACKGROUND OF THE INVENTION

The present invention relates to a semiconductor memory circuit, and more specially to an electrically erasable and programmable read only memory (hereinafter referred to as "EEPROM circuit").

Conventional technologies on EEPROM circuits are disclosed in U.S. Pat. No. 4,901,320 (hereinafter called "reference No. 1") and Japanese Patent Laid-Open Publication No. 64-59693 (hereinafter called "reference No. 2"). The reference No. 1 concerns a principle and a procedure for error correction for an EEPROM. The reference No. 2 concerns an EEPROM operable with use of low voltage and low current.

Recently, there has been an increasing demand for a highly reliable EEPROM circuit. That is, an EEPROM circuit which is operable with use of low voltage and low current, serviceable for a relatively longer period of life time, high in reliability, and capable of detecting faults, has been demanded.

BRIEF SUMMARY OF THE INVENTION

An object of the present invention is to provide an EEPROM circuit which is operable with low voltage and low current.

Another object of the present invention is to provide an EEPROM circuit which has a relatively longer service life.

Still another object of the present invention is to provide an EEPROM circuit which permits detection of its faults.

To accomplish the above mentioned objects, there is disclosed an EEPROM circuit for storing data into memory cells which employs the memory cells for storing data, each memory cell including two storage semiconductor elements, the storage semiconductor elements being permitted to have their operations stopped, respectively, in response to a first operation control signal and a second operation control signal; data control circuits each for performing reading, writing and erasing of data with respect to the two storage semiconductor elements of the memory cell, the data control circuit being adapted to supply a first level of voltage to each of the storage semiconductor elements so as to write data into a first one of the storage semiconductor elements and at the same time to erase data written in a second one of said storage semiconductor elements, the data control circuit being additionally adapted to amplify the data read out from the storage semiconductor element to generate an output data signal; and a data selector for selecting the memory cell, with respect to which read-out, writing-in and erasing of data are performed, in response to address data, the data selector being adapted to supply a first level of voltage to a word line of the selected memory cell.

DETAILED DESCRIPTION OF THE PREFERRED EMBODIMENTS

An EEPROM circuit according to the present invention will now be described in detail with reference to the accompanying drawings.

Figure 1:
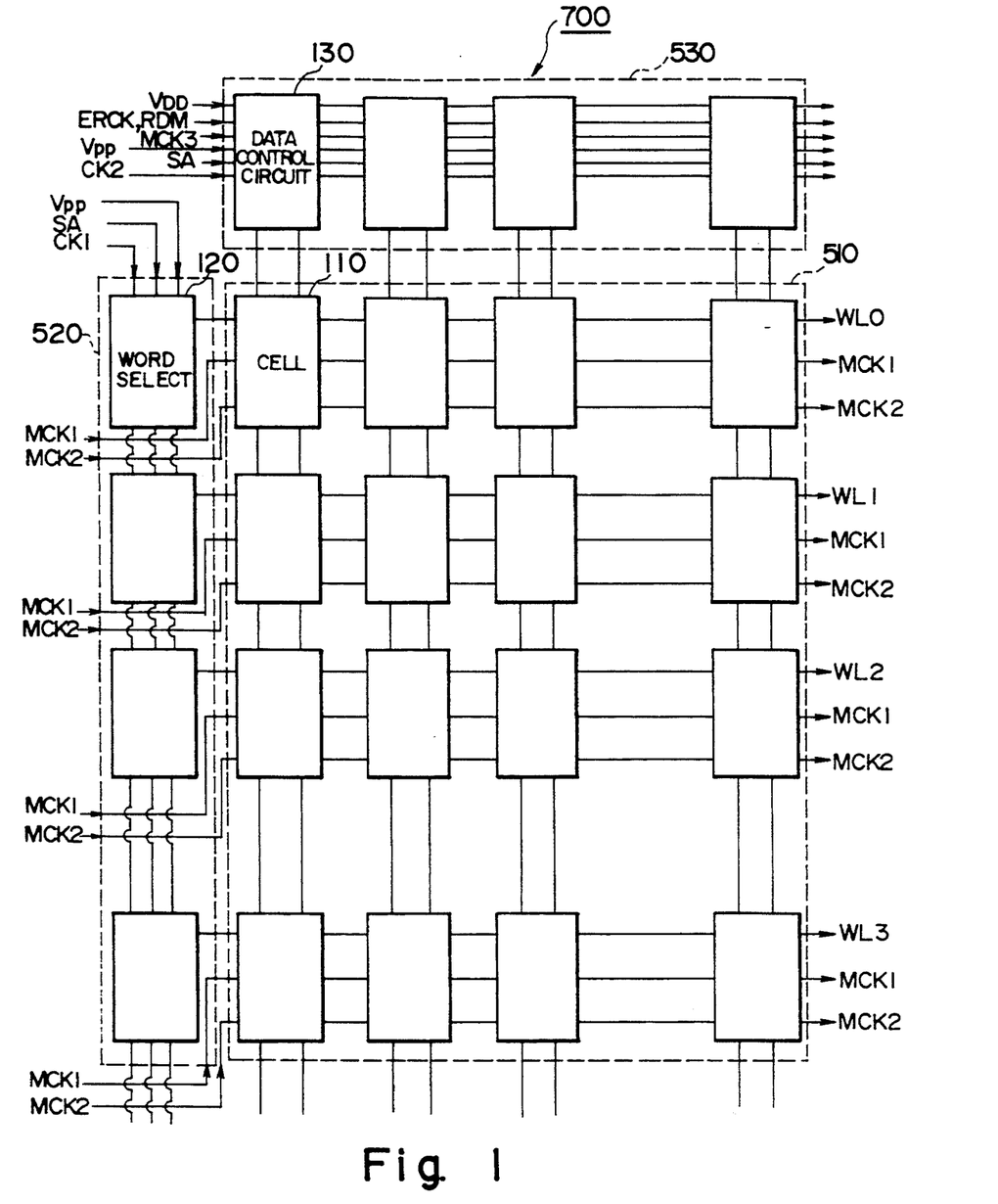
FIG. 1 is a schematic view illustrating a memory array of an EEPROM circuit according to the present invention.

An EEPROM circuit 700 shown in FIG. 1 is constituted by a memory cell section 510 composed of a plurality of memory cells 110, a word selector section 520 composed of word selectors 120 each adapted to select a word line, and a data control circuit section 530 composed of data control circuits 130 each adapted to perform data input/output operation as well as data reading, writing and erasing with respect to the memory cells. The memory cells 110, the word selectors 120 and data control circuits 130 are arranged in a matrix or array in columns and rows, i.e., in the horizontal and vertical directions to constitute the EEPROM circuit.

FIG. 1 shows an example in which the memory cells 110 and word selectors 120 are arrayed horizontally in four rows and the memory cells 110 and data control circuits 130 are arrayed vertically in four columns. The arrangement shown in FIG. 1 constitutes the EEPROM circuit 700 with 4 rows×4 columns=16 bits.

Figure 2:
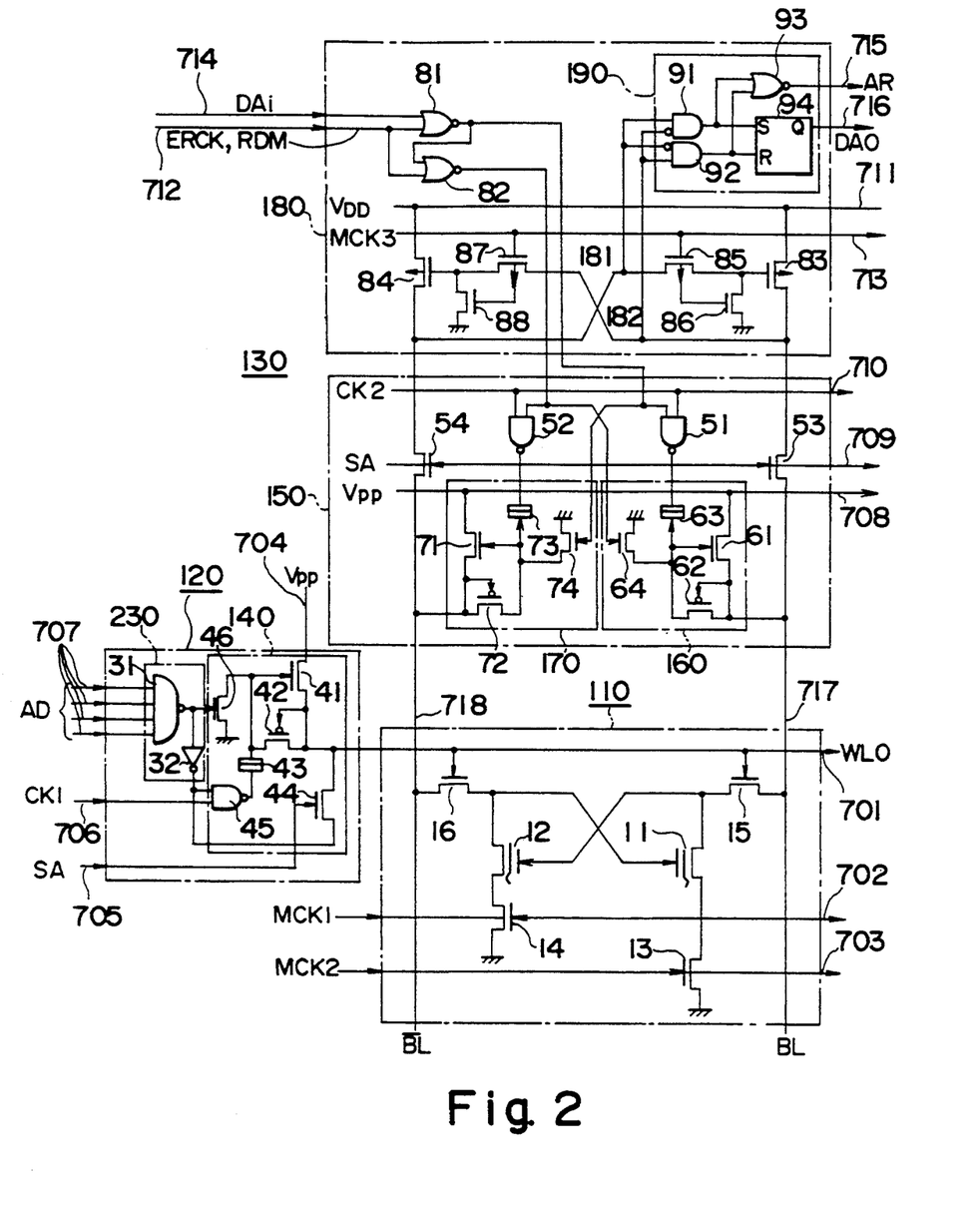
FIG. 2 is a partial circuit-section diagram illustrating an embodiment of the present invention.

FIG. 2 is a partial circuit section diagram of the EEPROM circuit shown in FIG. 1. The memory cell 110 is connected thereto with a word line 701, margin check signal lines 702 and 703, and complementary bit lines 717 and 718.

The margin check signal lines 702 and 703 supply signals MCK1 and MCK2 for inhibiting an operation of one of two memory transistors 11 and 12 in the memory cell 110, at the time of checking the margin of the threshold voltage Vt thereof.

The word selector 120 is connected thereto with a high voltage supply line 704, a read-out signal line 705, a clock pulse signal line 706, an address data signal line group 707 and the word line 701.

The read-out signal line 705 supplies a signal SA for reading out data stored in the memory cell 110.

The clock pulse supply line 706 supplies a clock pulse signal CK1 for supplying a word signal WLO to the word line 701.

The data control circuit is constituted by a write-in circuit 150 for supplying a write-in voltage causing the writing-in of data with respect to the memory cell 110, and a data input/output circuit 180 for performing the detection and amplification of data read out from the memory cell as well as the inputting/outputting of data.

The write-in circuit 150 is connected thereto with a high voltage supply line 708, a read-out signal line 709, a clock pulse supply line 710 and complementary bit lines 717 and 718.

The read-out signal line 709 supplies a signal SA as the read-out signal line 705 does the same as well.

The clock pulse supply line 710 supplies a clock pulse signal CK2 for causing writing-in and erasing of data with respect to the memory cell 110.

The data input/output circuit 180 is connected thereto with a power source voltage supply line 711, an erasure confirmation signal/read-out mode signal supply line 712, a margin check signal line 713, a data signal input line 714, an alarm signal line 715 and a data signal output line 716.

The erasure confirmation signal/read-out mode signal supply line 712 supplies either a signal ERCK for confirming the erasure of data stored in the memory cell 110 or a signal RDM for enabling the circuit to be ready for read-out of data stored in the memory cell 110. The margin check signal line 713 supplies a signal MCK3 which, when checking the margin of threshold voltage Vt of the two memory transistors 11 and 12 in the memory cell 110, prevents this checking operation from being affected by each of the two bit lines 717 and 718. The data signal input line 714 supplies data DAi being stored into the memory cell 110. The alarm signal line 715 supplies an alarm signal AR giving information on deterioration or fault of the memory cell 110. The data signal output line 716 supplies data DAo stored in the memory cell 110.

Respective constructions of each circuit will now be described hereinafter.

The memory cell 110 is constituted by first and second memory transistors 11, 12 of floating-gate type, first and second read-out N-channel type FET transistors 13, 14 operative in response to second and first margin check signals MCK2 and MCK1, and first and second selecting N-channel type FET transistors 15, 16 operative in response to the potential of the word line 701.

A gate of the memory transistor 11 is connected to the drain of the memory transistor 12 and also is connected to the bit line 718 via the selecting transistor 16. (It will be understood that reference herein to a "gate" of a transistor generally refers to its gate electrode.) Similarly, the gate of the memory transistor 12 is connected to the drain of the memory transistor 11 and also is connected to the bit line 717 via the selecting transistor 15. Namely, the memory transistors 11, 12 are connected to each other in a cross coupled form. Respective gates of the selecting transistors 15, 16 are connected to the word line 701. Respective sources of the memory transistors 11, 12 are grounded, respectively, via the read-out transistors 13, 14. Respective gates of the read-out transistors 13, 14 are connected to the margin check signal lines 703, 702, respectively.

The word selector 120 is constituted by an address decoder 230 for decoding an address AD, and a high voltage switch circuit 140 for applying a high voltage to the word line 701 and discharging the high voltage from the word line 701 in response to a output signal from the address decoder 230.

The address decoder 230 is constituted by a multi-input NAND gate 31 for decoding the address AD, and an inverter 32 for inverting the output signal generated at the gate 31. The high voltage switch circuit 140 is activated by an output signal from the address decoder 230 and drives the word line 701 in response to the clock signal CK1 upon application thereto of a high voltage Vpp.

The high voltage switch circuit 140 is constituted by transistors 41, 44, 46 each consisting of an N-channel type FET transistor, a transistor 42 consisting of zero-threshold FET transistor, a capacitor 43, and a two-input NAND gate 45. The zero threshold FET transistor is controlled the voltage level Vt being to fall within a range approximate to a zero level (0±0.4 V or so).

The use of this zero threshold FET transistor enables efficient elevation with less of voltage.

The gate of the transistor 41 is not only connected to one electrode of the capacitor 43 and to the word line 701 via the transistor 42 but also grounded via the transistor 46. An output terminal of the NAND gate 31 of the address decoder 230 is connected to the gate of the transistor 46. An output terminal of the NAND gate 45 is connected to the other electrode of the capacitor 43. Note that an output signal from the invertor 32 of the address decoder 230 and a clock signal CK1 being sent from the clock signal line 706 are inputted into the NAND gate 45. A source (drain) of the transistor 41 is connected to the high voltage source VPP while, on the other hand, a drain (source) thereof is connected to the word line 701 as well as to the gate of the transistor 42. An output terminal of the invertor 32 of the address decoder 230 is also connected to the word line 701 via the transistor 44. The read-out signal line 705 is connected to a gate of the transistor 44.

The operation of the high voltage switch circuit 140 will now be described. An alternative charge and discharge of the capacitor 43 is repeatedly carried out in response to the output signal from the address decoder 230 in accordance with the clock signal CK1 supplied from the clock signal line 706. In accordance with the charging and discharging operations of the capacitor 43, the transistor 41 is driven by the high voltage source Vpp to charge up the word signal WLO of the word line 701.

The write-in circuit 150 is constituted by two two-input NAND gates 51, 52 for NANDing a logical "1" or "0" signal corresponding to the input data DAi and a clock pulse signal CK2, two transfer transistors 53, 54 each consisting of an N-channel type FET transistor and being operative in response to the read-out signal SA having a logical "1" signal at the time of data reading, by being connected in series to the bit lines 717 and 718, and two voltage boosting circuits 160, 170 controlled in accordance with the output signals from the NAND gates 51, 52.

One of the voltage boosting circuit 160 is disposed for applying the high voltage Vpp to the bit line 717 by being activated in response to the output signal from the NAND gate 51, the circuit 160 including transistors 61, 64 each consisting of an N-channel type FET transistor, a transistor 62 consisting of a zero threshold FET transistor, and a capacitor 63. The other voltage boosting circuit 170 is disposed for applying the high voltage Vpp to the bit line 718 by being activated in response to the output signal from the NAND gate 52, the circuit 170 including, as in case of the circuit 160, transistors 71, 74 each consisting of an N-channel type FET transistor, a transistor 72 consisting of a zero threshold FET transistor, and a capacitor 73.

The two voltage boosting circuits 160, 170 have the same construction as in case of the high voltage switch circuit 140 namely the transistors 61, 71 corresponding to the transistor 41, the transistors 64, 74 corresponding to the transistor 46, the transistors 62, 72 corresponding to the transistor 43. As regards each of the step-up circuits 160, 170, a corresponding one of the bit lines 717, 718 corresponds to the word line 701 associated with the high voltage switch circuit 140 while, on the other hand, the NAND circuits 51, 52 correspond to the NAND circuit 45.

The data input/output circuit 180 is constituted by NOR gates 81, 82 for making logical operations of the write-in data DAi and either the erasure checking signal ERCK or read-out mode signal RDM, load transistors 83, 84 each consisting of a P-channel type FET transistor and being intended to perform differential amplification of a bit-line potential and current-to-voltage conversion, transistors 85, 87 each consisting of a P-channel type FET and being turned off upon receipt of a third margin check signal MCK3, transistors 86, 88 each consisting of an N-channel type FET transistor and being made "on" upon receipt of this third margin check signal MCK3, and a read-out circuit 190.

Each of the NOR gates 81, 82 has two input terminals, to one of which there is inputted the erasure checking signal ERCK or the read-out mode signal RDM. The NOR gate 81 has its second input terminal coupled to receive the write-in data DAi. NOR gate 82 has its second input terminal coupled to receive an output signal from the NOR gate 81. The output terminal of the NOR gate 81 is connected to one input terminal of the NAND gate 51 of the voltage boosting circuit 160 included in the write-in circuit 150 and also is connected to the gate of the transistor 74 of the voltage boosting circuit 170. Similarly, an output terminal of the NOR gate 82 is connected to one input terminal of the NAND gate 52 of the voltage boosting circuit 170 and also is connected to the gate of the transistor 64 included in the voltage boosting circuit 160. The load transistors 83, 84 are respectively connected in series to the bit lines 717, 718. The bit lines 717, 718 are connected to a constant voltage source VDD, via the load transistors 83, 84, respectively. The load transistor 83 has the gate which is grounded via the transistor 86 and is connected to a node 181 via the transistor 85. The node 181 is connected to the bit line 718. Similarly, the load transistor 84 has the gate which is grounded via the transistor 88 and is connected to a NODE 182 via the transistor 87. The node 82 is connected to the bit line 717. Note that the respective gates of the transistors 85, 86, 87 and 88 are connected to the margin check signal line 713.

The read-out circuit 190 is constituted by two-input AND gates 91, 92 for making logical operations of the output voltages of the load transistors 83, 84, a two-input NOR gate 93 adapted to produce a logical "1" level alarm signal AR when the outputs from the AND gates 91, 92 are out of coincidence, and a flip-flop circuit (hereinafter referred to as "FF") 94 which is set or reset by the output signal from the AND gate 91 or 92 to produce a read-out data DAo.

The AND gate 91 is supplied, at its input terminals, with a signal of the node 181 and an inverted signal of the NODE 182. Similarly, the AND gate 92 is supplied, at its input terminals, with an inverted signal of the node 181 and a signal of the node 182. The output signal from the AND gate 91 is connected to a set terminal of the flip-flop 94 and also is supplied to one input terminal of the NOR gate 93. The output signal from the AND gate 92 is connected to a reset terminal of the flip-flop 94 and also is supplied to the other input terminal of the NOR gate 93. The output signal from the NOR gate 93 becomes an alarm signal AR. The output signal from the flip-flop 94 becomes a read-out data signal DAo.

The data input/output circuit 180 is constructed such that supply of the third margin check signal MCK3 makes each of the transistors 85, 87 "05A" and turns a corresponding one of the transistors 86, 88 "on" to thereby release the cross coupled condition of the load transistors 83 and 84.

Operation of FIG. 2 Embodiment

Figure 3:
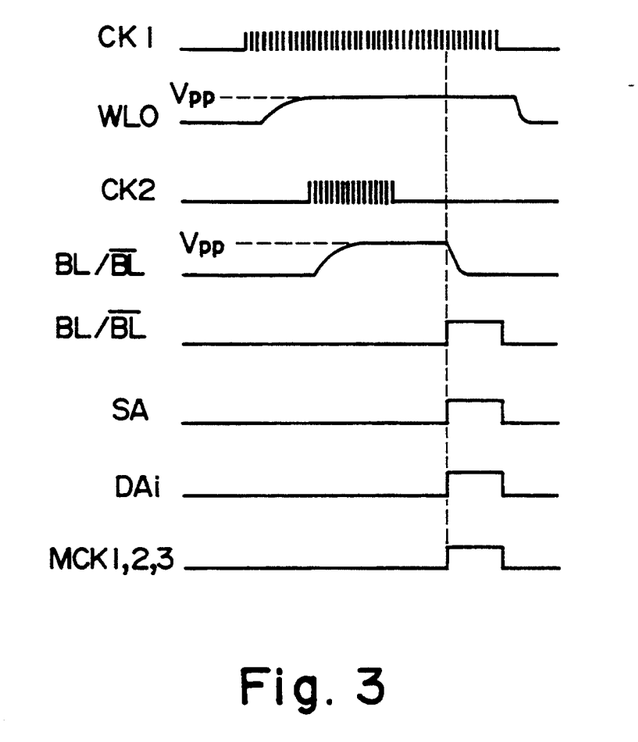
FIG. 3 is a timing chart for illustrating an operation of the embodiment illustrated in FIG. 2.
Figure 4:
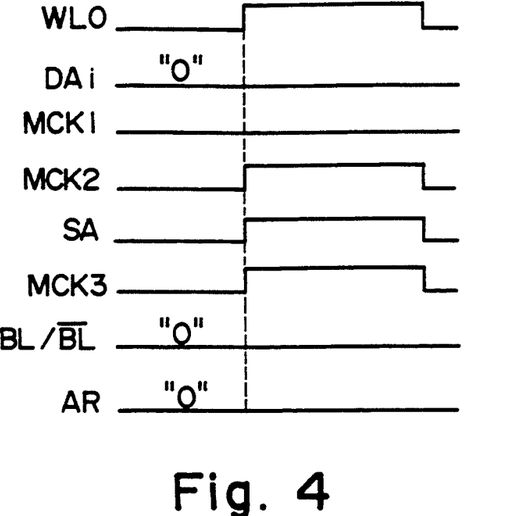
FIG. 4 is a timing chart for illustrating an operation of checking a writing margin of threshold voltage Vt of a memory transistor incorporated in the embodiment of FIG. 2.
Figure 5:
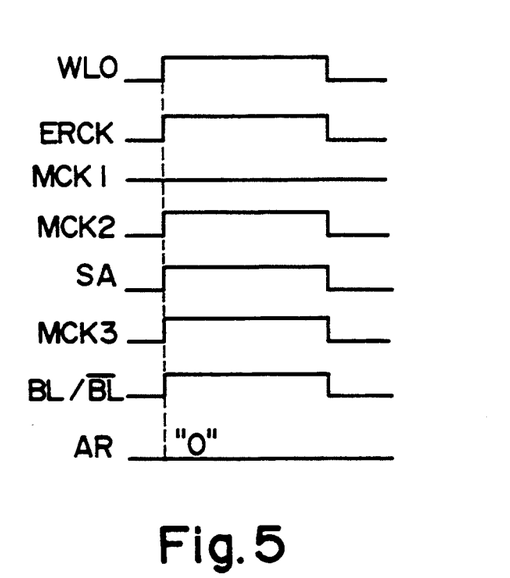
FIG. 5 is a timing chart for illustrating an operation of checking an erasing margin of threshold voltage Vt of a memory transistor incorporated in the embodiment of FIG. 2.

Next, the operation of the EEPROM circuit according to this embodiment will be explained. FIG. 3 is a timing chart for illustrating the writing, the erasing, and the reading operations; FIG. 4 is a timing chart for illustrating the margin check operation at the time when the writing operation is performed; and FIG. 5 is a timing chart for illustrating the margin check operation at the time when the erasing operation is performed.

(1) Writing/Erasing Operation

As illustrated in FIG. 2, when the clock pulse CK1 is supplied to the NAND gate 45 of the word selector 120 as a first stage of operation, only the high voltage switch circuit 140 selected upon its receipt of the output signal from, for example, the address decoder 230 is activated with the result that the high level of voltage Vpp is applied to the word line 701. Then, the selecting (or access) transistors 15, 16 in the memory cell 110 are turned on, so that this memory cell 110 is brought into a selected state. Since, at this time, the read-out signal SA is stopped from entering into the circuit 140, the transistor 44 is kept inoperative. (Thus, it will be seen in FIG. 3 that when CK1 first becomes active, SA is still low.)

Next, when the clock pulse CK2 is supplied to the NAND gates 51, 52 in the write-in circuit 150, the NAND gates 51, 52 become operative and either one of the two voltage boosting circuits 160, 170 is thereby activated in response to the output signals from the data input NOR gates 81, 82. Consequently, one of the bit line pair 717 or 718 is charged up to the high level of voltage Vpp and, at the same time, the bit line 718 or 717 has a voltage level of 0 V through the pull down operation of the transistor 64 or 74. For this reason, the selected memory transistors 11, 12 are brought into an operational mode in which, in response to the write-in data signal DAi becoming active (at the broken line in FIG. 3), the transistor 11 is decreased in voltage level Vt while the transistor 12 is increased in voltage level Vt, namely, an operational mode in which writing of data is carried out. Or alternatively, the selected memory transistors 11, 12 are brought into an operational mode in which the transistor 11 is increased in voltage level Vt while the transistor 12 is decreased in voltage level Vt, namely, an operational mode in which erasing of data is carried out. For instance, when writing of data is performed with respect to the memory transistor 11, erasing of data is performed with respect to the storage transistor 12.

According to the above-mentioned writing/erasing operation, since both the writing and the erasing are simultaneously performed on the same word line 701 in regard to each bit, this writing/erasing operation only requires a half of writing/erasing time as compared to that required in the conventional arrangement wherein erasing is performed after writing is done.

(2) Read-Out Operation

When it is desired to read out data, as shown in FIG. 2 the read-out signal SA is set to a logical level "1" simultaneously with the setting of the first, second and third margin check signals MCK1, MCK2 and MCK3 to a logical level "1". Then, the reading transistors 13, 14 in the memory cell 110 are each turned on while the memory transistors 11, 12 each have a voltage level of 0 V at their source region. Thereby, the contents stored in the transistors 11, 12, i.e., the electric currents corresponding to the voltage levels Vt thereof, are allowed to pass through the bit lines 717, 718 by way of the selecting transistors 15, 16.

Simultaneously, since the transfer transistors 53, 54 in the write-in circuit 150 are turned on in response to the read-out signal SA, the electric currents passing through the bit lines 717, 718 are by the load transistors 83, 84, differentially amplified in a form of voltage level. Thus, a potential difference, which corresponds to the difference between the voltage levels of the memory transistors 11 and 12, is entered into the input terminals of the AND gates 91, 92. Therefore, if the potential of the bit line 717 is higher than that of the bit line 718, it is possible to read out a data signal DAo having a logical level "1" from the flip-flop circuit 94. If the former potential is lower than the latter potential, a data signal DAo having a logical level "0" will be read out from the circuit 94. When selection of the word line 701 has been completed, the word line 701 is discharged to approximately 0 V through operation of the transistor 46 in the word selector 120.

In this read-out operation, the electric currents corresponding to the difference between the voltage levels stored in the first and second memory transistors 11, 12 are converted to a potential difference by the load transistors 83, 84, thus to be read out in the form of a logical level "1" or "0". Therefore, even when the difference between the voltage levels of the first and second memory transistors 11, 12 becomes small due to deterioration thereof, it is possible to perform reading-out of data with no error, thereby remarkably improving the service life of the memory cell 110.

In addition, even when, during the operation of the EEPROM circuit, either one of the memory transistors 11, 12 becomes defective, only if the other transistor 11 or 12 is normally operative, it is possible to correctly read out data involved. This improves the yield of defective products. Furthermore, since the circuit constructions of the memory cell 110 and its peripheral circuits are simplified, economical integration with a small size of occupation area becomes possible up to several-K-bit quantity.

(3) Margin Check Operation

The margin check operation of the memory transistor 11 will now be explained referring to FIGS. 4 and 5.

(3) (a) Write-In Margin Check Operation

As shown in FIG. 4, the word address AD to be checked is applied to the NAND gate 31 in the word selector 120 to make the word line 701 "1" for example via the inverter 32 and the transistor 44. Next, a voltage signal having a level "0" is applied, as the write-in data DAi, to the NOR gate 81 in the data input/output circuit 180. Simultaneously, the first margin check signal MCK1 is made "0" and the second margin check signal MCK2 is made "1".Thus, the read-out transistor 14 is turned off to make the memory transistor 12 inoperative. As a result, only the memory transistor 11 is made operative. On the other hand, the transistors 74, 72 in the write-in circuit 150 and the selecting transistor 16 in the memory cell 110 are each turned on, so that a voltage having a level of substantially 0 V is applied to the gate of the storage transistor 11. As a result, a potential corresponding to the write-in depth of the storage transistor 11 is read out from this transistor 11 to the bit line 717 via the selecting transistor 15.

Furthermore, since the third margin check signal MCK3 is made "1", the potential on the bit line 717 can be outputted via the transfer transistor 53, and via the AND gates 91, 92 and NOR gate 93 in the data input/output circuit 180 in this order. That is to say, if the memory transistor 11 is in a normal condition of operation, it will be in a condition of "on", so that the bit lines 717 and 718 are both made "0". Therefore, the NOR gate 93 generates an alarm signal AR of "1" from the alarm signal line 715. When it is now assumed that the storage transistor 11 is short of the write-in margin quantity, the bit line 717 has a logical signal level of not "0" but "1" with the result that the alarm signal AR level becomes "0".

(3) (a) Erasure Margin Check Operation

When it is desired to perform the erasure check operation, as shown in FIG. 5, the erasure check signal ERCK having a logical level of "1" is applied to the data inputting NOR gates 81, 82 in the data input/output circuit 180 to make the transistors 74, 64, 72 and 62 in the voltage boosting circuits 160, 170, respectively, "off". Then, a voltage which has a level substantially equal to the power source potential VDD is applied to the gate of the storage transistor 11 through the load transistor 84, transfer transistor 54 and selecting transistor 16. Thus, a potential which corresponds to a condition of erasure in the memory transistor 11 is read out into the bit line 717 via the selecting transistor 15.

The potential thus read out into the bit line 717 can be read out as the alarm signal AR via the AND gates 91, 92 and NOR gate 93 in the read-out circuit 190. Namely, if the memory transistor 11 is in a condition of normal operation, it will be in a condition of "off" with the result that both of the bit lines 717, 718 have a logical signal level of "1". Therefore, the alarm signal AR has a level of "0". When it is now assumed that the memory transistor 11 is short of the erasure margin quantity, the bit line 717 has a logical signal level of not "1" but "0", the alarm signal AR will becomes "1".

As regards the write-in margin check and erasure margin check operations under the above items (a) and (b), if the operations are performed in the same manner as previously mentioned with the first margin check signal MCK1 and the second margin check signal MCK2 being made, respectively, "1" and "0", it will be possible to realize performance of those checking operations.

The above-mentioned procedure for the margin check operations, i.e., the procedure for applying the margin check signals MCK1, MCK2, MCK3, read-out signal SA, etc. can easily be performed with use of a microcomputer or the like. Namely, it is possible to readily check the voltage level Vt margin of the memory transistors 11, 12 by executing the procedural programs or the like for the operation of such a microcomputer. Therefore, when manufacturing (forwarding) the products, it is possible to improve the yield of defective products through performance of the margin check operations to thereby enhance the reliability on the EEPROM circuit to a greater extent. In addition, when a user or the like operates the circuit, the margin checking can be readily carried out, and he can receive information on deterioration or fault of the memory cell 110 through generation of the alarm signal AR.

The third margin check signal MCK3 is used for releasing the crossing connection of the load transistors 83 and 84. This makes it possible to perform the margin check operation highly precisely without making the operation of one of the bit lines 717, 718 free of the operation of the other thereof.

The present invention is not limited to the above-mentioned embodiment but permits various modifications to be made. For instances, the transistors 13 to 16 in the memory cells 110, - - - may be each constituted by a P-channel type FET transistor or the like, or the word selector 120, write-in circuit 150 and data input/output & sense circuit 180 may be modified into other circuitry. Data input/output & sense circuit 180 may be modified into other circuit constructions than those in FIG. 1 by using other transistors. For instance, the circuit 94 in the read-out circuit 190 may be replaced by a sense amplifier.

Further, the margin checking function illustrated in the present invention is applicable not only to the construction of the EEPROM circuit shown in the embodiments but also to the other constructions. For instance, this function can be applied to an EEPROM circuit having memory cells containing two memory transistors, that is, an-EEPROM circuit having such memory cells as shown in the embodiment of the present invention. By this application, it is possible to stop operation of one memory transistor and perform, in this state, the margin check operation for the other storage transistor.

What is claimed is:

1. A semiconductor memory circuit having memory cells for storing data therein, comprising:
   the memory cells for storing data, each memory cell including two storage semiconductor elements, the storage semiconductor elements being permitted to have their operations stopped, respectively, in response to a first operation control signal and a second operation control signal;
   a data control circuit for performing reading, writing and erasing of data with respect to the two storage semiconductor elements of the memory cell, the data control circuit being adapted to supply a first level of voltage to each of the storage semiconductor elements so as to write data into a first one of the storage semiconductor elements and at the same time to erase data written in a second one of said storage semiconductor elements, the data control circuit being additionally adapted to amplify the data read out from the storage semiconductor element to generate an output data signal; and
   a data selector circuit for selecting the memory cell, with respect to which reading-out, writing-in and erasing of data are performed, in response to address data, the data selector circuit being adapted to supply said first level of voltage to a word line of the selected memory cell.

2. A semiconductor memory circuit as set forth in claim 1, wherein the two storage semiconductor elements of the memory cell each is constituted by a floating-gate type transistor permitting electrical writing, reading-out, and erasing of data to be performed with respect thereto, the first storage semiconductor element having a gate connected to a drain of the second storage semiconductor element, the second storage semiconductor element having a gate connected to a drain of the first storage semiconductor element, the first and second storage semiconductor elements having their sources grounded via a first and a second switch circuit, respectively.

3. A semiconductor memory circuit as set forth in claim 2, wherein the first and the second switch circuits respectively operate in response to the first and said second operation control signals.

4. A semiconductor memory circuit as set forth in claim 2, wherein the first and the second switch circuits are constituted by transistors, respectively.

5. A semiconductor memory circuit as set forth in claim 1, wherein the data control circuit is composed of a write-in circuit for writing data into the memory cell and a data input/output circuit for inputting and outputting data.

6. A semiconductor memory circuit as set forth in claim 5, wherein the write-in circuit includes two voltage boosting circuits for supplying to the two storage semiconductor elements of the memory cell said first level of voltage for activation thereof.

7. A semiconductor memory circuit as set forth in claim 6, wherein the two voltage boosting circuit activate only one of the two storage semiconductor elements in response to data inputted into the semiconductor memory circuit.

8. A semiconductor memory circuit as set forth in claim 6, wherein a first one of the two voltage boosting circuit supplies said first level of voltage to a drain of the first storage semiconductor element in the memory cell and to a gate of the second storage semiconductor element in the memory cell.

9. A semiconductor memory circuit as set forth in claim 6, wherein a second one of the two voltage boosting circuits supplies said first level of voltage to a drain of the second storage semiconductor element in the memory cell and a gate of the first storage semiconductor element in the memory cell.

10. A semiconductor memory circuit as set forth in claim 8, wherein the first level of voltage supplied by the first voltage boosting circuit is supplied via a third switch circuit as well as via a first one of complementary first and second bit lines.

11. A semiconductor memory circuit as set forth in claim 10, wherein the third switch circuit is constituted by a transistor and is operative in corresponding relation to a condition of the word line.

12. A semiconductor memory circuit as set forth in claim 10, wherein the first level of voltage supplied by the first voltage boosting circuit is supplied via a fourth switch circuit as well as via a second one of said complementary first and second bit lines.

13. A semiconductor memory circuit as set forth in claim 12, wherein the fourth switch circuit is constituted by a transistor and is operative in corresponding relation to a condition of the word line.

14. A semiconductor memory circuit as set forth in claim 5, wherein the data input/output circuit includes a differential amplifier circuit for effecting differential amplification of data read out from the two storage semiconductor elements in the memory cell.

15. A semiconductor memory circuit as set forth in claim 14, wherein the differential amplifier circuit includes fifth and sixth switch circuits each being constituted by a respective transistor, the fifth switch circuit being disposed between a first bit line and a line for supplying a second voltage level and having a gate connected to a second bit line, the sixth switch circuit being interposed between the second bit line and the line for supplying the second voltage level and having a gate connected to the first bit line.

16. A semiconductor memory circuit as set forth in claim 15, wherein the differential amplifier circuit includes seventh and eighth switch circuits, the seventh switch circuit being interposed between a gate of the fifth switch circuit and the second bit line, the eighth switch circuit being disposed between a gate of the sixth switch circuit and the first bit line, the seventh and eighth switch circuits being operative in response to a third operation control signal.

17. A semiconductor memory circuit as set forth in claim 16, wherein the differential amplifier circuit includes ninth and tenth switch circuits, the ninth and tenth switch circuits being operative in response to a third operation control signal to supply a third voltage level to gates of the fifth and sixth switch circuits, respectively.

18. A semiconductor memory circuit as set forth in claim 16, wherein the seventh and eighth switch circuits perform their operations which are counter to those of the ninth and tenth switch circuits.

19. A semiconductor memory circuit as set forth in claim 5, wherein the data input/output circuit includes a read-out circuit for comparing to each other two data read out from the two storage semiconductor elements in the memory cell to generate an output binary signal.

20. A semiconductor memory circuit as set forth in claim 19, wherein the two data read out from the two storage semiconductor elements are inputted into two AND circuits included in the read-out circuit, output signals from the two AND circuits are sent to set and reset terminals of a flip-flop circuit, respectively, and an output signal from the flip-flop circuit provides said output binary signal.

21. A semiconductor memory circuit as set forth in claim 19, wherein the read-out circuit includes an abnormality sensing circuit which, at the time when the two data read out from the two storage semiconductor elements are abnormal, provides information on this abnormality.

22. A semiconductor memory circuit as set forth in claim 21, wherein the abnormality sensing circuit is constituted by a NOR circuit.

23. A semiconductor memory circuit as set forth in claim 19, wherein the read-out circuit is a sense amplifier.

24. A semiconductor memory circuit as set forth in claim 1, wherein the first voltage level is a high level of voltage.

25. A semiconductor memory circuit as set forth in claim 15, wherein the second voltage level is a power source voltage.

26. A semiconductor memory circuit as set forth in claim 17, wherein the third voltage level is a ground voltage.

* * * * *